US010811800B1

(12) United States Patent
Blackburn et al.

(10) Patent No.: US 10,811,800 B1
(45) Date of Patent: Oct. 20, 2020

(54) CABLE CONNECTOR ASSEMBLY FOR AN INTEGRATED CIRCUIT ASSEMBLY

(71) Applicant: TE CONNECTIVITY CORPORATION, Berwyn, PA (US)

(72) Inventors: Christopher William Blackburn, Bothell, WA (US); Jeffery Walter Mason, North Attleboro, MA (US); Michael David Herring, Apex, NC (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 16/531,216

(22) Filed: Aug. 5, 2019

(51) Int. Cl.
*H01R 12/70* (2011.01)
*H01R 12/75* (2011.01)
(Continued)

(52) U.S. Cl.
CPC ......... *H01R 12/75* (2013.01); *H01L 23/3672* (2013.01); *H01R 13/533* (2013.01); *H01L 21/4882* (2013.01); *H01L 23/34* (2013.01); *H01L 23/36* (2013.01); *H01L 23/3677* (2013.01); *H01L 2023/405* (2013.01); *H01L 2023/4043* (2013.01); *H01L 2225/06589* (2013.01); *H01R 12/52* (2013.01); *H01R 12/62* (2013.01); *H01R 12/7076* (2013.01); *H01R 12/712* (2013.01); *H01R 13/055* (2013.01); *H01R 13/665* (2013.01); *H01R 13/6658* (2013.01); *H05K 1/0203* (2013.01); *H05K 1/0212* (2013.01); *H05K 7/209* (2013.01); *H05K 7/2039* (2013.01); *H05K 7/20154* (2013.01);
(Continued)

(58) Field of Classification Search
CPC ............ H01R 12/7076; H01R 13/6658; H01R 12/52; H01R 12/62; H01R 13/665; H01R 12/712; H01R 13/055; H01L 23/36; H01L 23/3677; H01L 23/3672; H01L 21/4882; H01L 23/34; H01L 2023/4043; H01L 2023/405; H01L 2225/06589; H05K 7/20409; H05K 7/20418; H05K 1/0203; H05K 7/2039; H05K 7/209; H05K 7/20154; H05K 1/0212; H05K 7/20972
USPC .......... 439/485, 487, 70, 264, 525; 361/678, 361/679.54, 688, 690, 697, 703, 704, 707, 361/709, 710, 714, 715, 718, 719, 720, 361/722
See application file for complete search history.

(56) References Cited

U.S. PATENT DOCUMENTS

| | | | |
|---|---|---|---|
| 6,234,842 B1 * | 5/2001 | Keay ..................... | H01R 4/646 361/707 |
| 9,011,177 B2 * | 4/2015 | Lloyd ................... | H01B 11/00 439/607.47 |
| 2015/0280368 A1 * | 10/2015 | Bucher ................ | G02B 6/4269 439/487 |

* cited by examiner

*Primary Examiner* — Abdullah A Riyami
*Assistant Examiner* — Justin M Kratt (57) ABSTRACT

A cable connector assembly includes a housing having a first end mounted to an integrated circuit substrate over an integrated circuit component and a second end supporting a heat sink used to dissipate heat from the integrated circuit component. The housing includes a pocket receiving a cable module having a connector housing holding conductors and cables connected to the conductors. The connector housing has a mating end facing the integrated circuit substrate with the conductors arranged at the mating end for interfacing with integrated circuit conductors. A thermal shield is received in the pocket having an opening receiving the (Continued)

cables. The thermal shield has a thermal shielding wall positioned between the cables and the heat sink to provide a thermal barrier between the cables and the heat sink.

20 Claims, 6 Drawing Sheets

(51) Int. Cl.
*H01R 13/533* (2006.01)
*H01L 23/367* (2006.01)
*H05K 7/20* (2006.01)
*H01L 21/48* (2006.01)
*H01R 13/66* (2006.01)
*H01R 13/05* (2006.01)
*H05K 1/02* (2006.01)
*H01L 23/40* (2006.01)
*H01R 12/71* (2011.01)
*H01R 12/62* (2011.01)
*H01R 12/52* (2011.01)
*H01L 23/36* (2006.01)
*H01L 23/34* (2006.01)

(52) U.S. Cl.
CPC ..... *H05K 7/20409* (2013.01); *H05K 7/20418* (2013.01); *H05K 7/20972* (2013.01)

CABLE CONNECTOR ASSEMBLY FOR AN INTEGRATED CIRCUIT ASSEMBLY

BACKGROUND OF THE INVENTION

The subject matter herein relates generally to cable connector assemblies for an integrated circuit assembly of an electronic system.

The ongoing trend toward smaller, lighter, and higher performance electrical components and higher density electrical circuits has led to the development of surface mount technology in the design of printed circuit boards and integrated circuit assemblies. Conventional systems are struggling with meeting signal and power output from an integrated circuit assembly because there is a need for smaller size and higher number of conductors while maintaining good electrical performance. Conventional integrated circuit assemblies have a limited amount of surface area along the bottom of the integrated circuit assembly for conductors to electrically connect to a host circuit board.

For increased density in electronic systems and for enhanced performance in electronic systems, some electronic systems utilize cable connector assemblies extending from connectors on the circuit board. However, conventional electronic systems may require use of a heat sink to dissipate heat from the components, such as the integrated circuit. The temperature of the heat sink may damage cables routed through the electronic system in proximity to the heat sink.

A need remains for a high speed cable connector assembly having improved electrical performance and thermal protection for the cables of the cable connector assembly.

BRIEF DESCRIPTION OF THE INVENTION

In one embodiment, a cable connector assembly for an electronic system is provided. The cable connector assembly includes a housing that has a first end and a second end. The first end is configured to be mounted to an integrated circuit substrate over an integrated circuit component on the integrated circuit substrate. The second end is configured to support a heat sink used to dissipate heat from the integrated circuit component. The housing includes a pocket open through the housing. A cable module is received in the pocket. The cable module includes a connector housing that holds conductors arranged in a row. The connector housing has a mating end and a cable end. The mating end faces the integrated circuit substrate and the conductors are arranged at the mating end for interfacing with integrated circuit conductors of the integrated circuit substrate. The cable module includes cables connected to corresponding conductors. The cables extend from the cable end. A thermal shield is received in the pocket. The thermal shield has an opening that receives the cables. The thermal shield has a thermal shielding wall positioned between the cables and the heat sink to provide a thermal barrier between the cables and the heat sink.

In a further embodiment, a cable connector assembly for an electronic system is provided. The cable connector assembly includes a housing that has a first end and a second end. The housing has sides that extend between the first end and the second end. The housing has a cavity defined by the sides between the first end and the second end. The first end is configured to be mounted to an integrated circuit substrate over an integrated circuit component on the integrated circuit substrate. The cavity is open at the first end to expose the integrated circuit component through the cavity. The second end is configured to support a heat sink used to dissipate heat from the integrated circuit component. The cavity is open at the second end to receive a connecting portion of the heat sink used to thermally connect to the integrated circuit component. The housing includes pockets at corresponding sides open through the housing. Cable modules are received in corresponding pockets. Each cable module includes a connector housing that holds conductors arranged in a row. The connector housing has a mating end and a cable end. The mating end faces the integrated circuit substrate and the conductors are arranged at the mating end for interfacing with integrated circuit conductors of the integrated circuit substrate. The cable module includes cables connected to corresponding conductors. The cables extend from the cable end. Thermal shields are received in corresponding pockets and receive corresponding cable modules. Each thermal shield has an opening that receives the cables of the corresponding cable module. The thermal shield has a thermal shielding wall positioned between the cables and the heat sink to provide a thermal barrier between the cables and the heat sink.

In another embodiment, an electronic system is provided. The electronic system includes a host circuit board that has host conductors. An integrated circuit assembly is coupled to the host circuit board. The integrated circuit assembly has an integrated circuit substrate that includes upper integrated circuit conductors on an upper surface of the integrated circuit substrate and lower integrated circuit conductors on a lower surface of the integrated circuit substrate. The lower integrated circuit conductors are coupled to corresponding host conductors. The integrated circuit assembly includes an integrated circuit component on the upper surface of the integrated circuit substrate. A heat sink is coupled in thermal communication with the integrated circuit substrate. A cable connector assembly is coupled to the integrated circuit assembly. The cable connector assembly includes a housing that has a first end and a second end. The first end is mounted to the integrated circuit substrate over the integrated circuit component. The second end supports the heat sink above the integrated circuit component. The housing includes a pocket open through the housing. The cable connector assembly includes a cable module received in the pocket. The cable module includes a connector housing that holds conductors that are arranged in a row. The connector housing has a mating end and a cable end. The mating end faces the integrated circuit substrate and the conductors are arranged at the mating end for interfacing with the upper integrated circuit conductors. The cable module includes cables that are connected to corresponding conductors. The cables extend from the cable end. The cable connector assembly includes a thermal shield that is received in the pocket. The thermal shield has an opening that receives the cables. The thermal shield has a thermal shielding wall positioned between the cables and the heat sink to provide a thermal barrier between the cables and the heat sink.

DETAILED DESCRIPTION OF THE INVENTION

Figure 1:
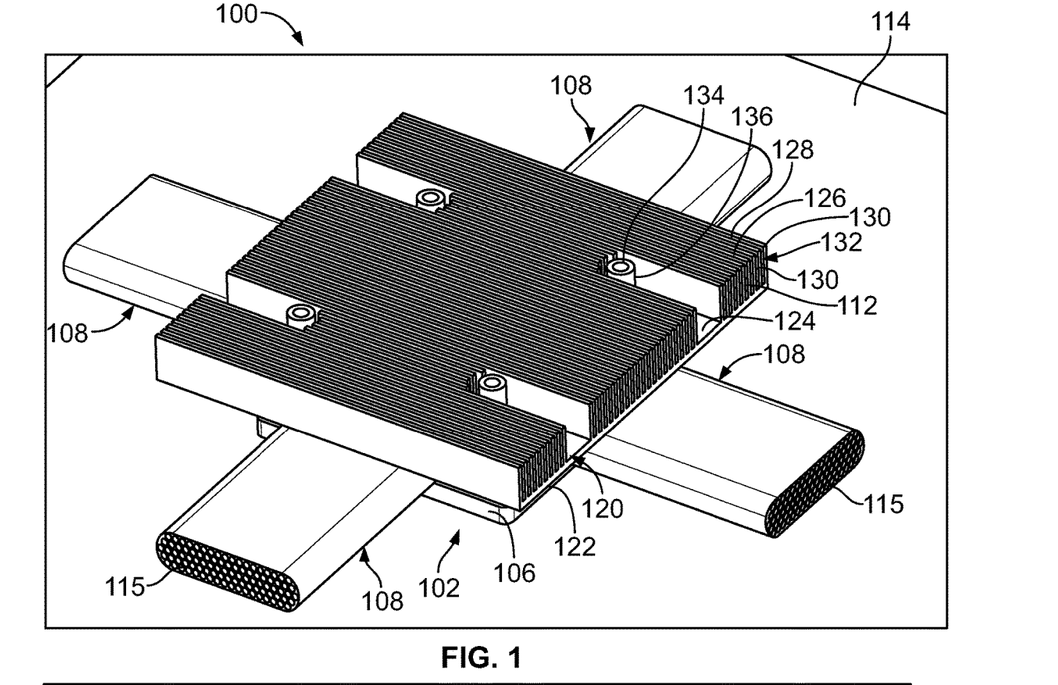
FIG. 1 is a top perspective view of an electronic system showing a cable connector assembly formed in accordance with an exemplary embodiment.

FIG. 1 is a top perspective view of an electronic system 100 formed in accordance with an exemplary embodiment. The electronic system 100 includes a cable connector assembly 102 electrically connected to an integrated circuit assembly 104 (shown in FIG. 3). The cable connector assembly 102 includes a housing 106, one or more cable assemblies 108 coupled to the integrated circuit assembly 104, and one or more thermal shields 110 (shown in FIG. 3) configured to thermally protect the cable assemblies 108. For example, the thermal shields 110 are used to thermally shield the cable assemblies 108 from a heat sink 112 provided to dissipate heat from the integrated circuit assembly 104. The housing 106 is used for coupling the cable assemblies 108 to the integrated circuit assembly 104, such as for locating and/or supporting the cable assemblies 108 for coupling to the integrated circuit assembly 104. The housing 106 may be used for coupling the heat sink 112 to the integrated circuit assembly 104. For example, the housing 106 may support the heat sink 112 on the integrated circuit assembly 104.

In an exemplary embodiment, a bottom of the integrated circuit assembly 104 is coupled to a host circuit board 114 (also shown in FIG. 3), such as a motherboard, and the housing 106 and the cable assemblies 108 are coupled to a top of the integrated circuit assembly 104 opposite the host circuit board 114. In an exemplary embodiment, cables 115 of the cable assemblies 108 exit the housing 106 from a side of the housing 106. For example, the cables 115 may transition at a right angle within the housing 106 for mating to the integrated circuit assembly 104. In the illustrated embodiment, the cables 115 extend generally horizontally, such as parallel to the host circuit board 114, limiting the height of the electronic system 100. For example, the cables 115 remain located below the heat sink 112. However, in alternative embodiments, the cables 115 may extend vertically (see, for example, FIG. 2), such as extending perpendicular to the host circuit board 114. In such embodiment, the cables 115 may extend through the heat sink 112, allowing tighter spacing of other components on the host circuit board 114 adjacent the electronic system 100. In various embodiments, the cable assemblies 108 may include electrical cables having copper signal conductors for transmitting signals. In other various embodiments, the cable assemblies 108 may include fiber optic cables having optical fibers for transmitting signals.

The electronic system 100 allows greater density and connections to the integrated circuit assembly 104 by connecting to both the top and the bottom of the integrated circuit assembly 104. For example, a subset of the signals is routed through the bottom of the integrated circuit assembly 104 into the host circuit board 114 and a subset of the signals are routed through the top of the integrated circuit assembly 104 to the cable assemblies 108. The performance and design efficiency are enhanced by increasing the number of connection positions to the integrated circuit assembly 104. In an exemplary embodiment, the cable assemblies 108 are coupled to the integrated circuit assembly 104 at multiple locations (e.g., at four sides of the chip) to increase density of the electronic system 100 and shorten electrical paths of the electronic system 100. The arrangement reduces the number of electrical interfaces needed along the bottom of the integrated circuit assembly 104 by additionally coupling to the top of the integrated circuit assembly 104. Additionally, some signals, such as high speed data signals, may be transferred directly from the integrated circuit assembly 104 by the cable assembly 108 rather than being first routed through the host circuit board 114 and/or may be routed along longer signal paths through the cables rather than being routed through traces of the host circuit board 114.

In an exemplary embodiment, the integrated circuit assembly 104 includes an integrated circuit substrate 116 (shown in FIG. 3) and an integrated circuit component 118 (shown in FIG. 3) provided on the integrated circuit substrate 116. The integrated circuit substrate 116 has integrated circuit conductors that provide electrical paths between the integrated circuit component 118 and the cable assemblies 108 and that provide electrical paths between the integrated circuit component 118 and the host circuit board 114. The integrated circuit substrate 116 may be a printed circuit board. The integrated circuit conductors may be circuits, pads, traces, vias, and the like of the printed circuit board. The cable assemblies 108 are configured to be coupled to the integrated circuit conductors, such as being terminated directly to the integrated circuit conductors or indirectly coupled by other elements. For example, in various embodiments, the cable assemblies 108 may be terminated to the integrated circuit conductors at a separable mating interface, such as by a compression mounting using spring beams. In other various embodiments, the cable assemblies 108 may be terminated to the integrated circuit conductors at a non-separable interface, such as by soldering or by a press-fit connection. The cable assemblies 108 may be electrically connected to the integrated circuit conductors using contacts, pins, solder balls, conductive elastomeric columns, or other intervening conductive elements. In other various embodiments, the cable assemblies 108 may be coupled to the integrated circuit conductors at an optic interface, such as using fiber optic elements. In various embodiments, the integrated circuit conductors may be coupled to the host circuit board 114 at a lower mating interface, such as an LGA interface, a BGA interface, and the like.

The heat sink 112 includes a base 120 provided at a bottom 122 of the heat sink 112. The base 120 includes a plate 124. The heat sink 112 includes heat dissipating elements 126 extending from the base 120 at a top 128 of the heat sink 112. In the illustrated embodiment, the heat dissipating elements are parallel fins 130 separated by channels 132; however, other types of heat dissipating elements may be provided in alternative embodiments, such as posts, a manifold having cooling fluid channels, or other types of heat dissipating elements. In an exemplary embodiment, hardware 134 is provided for securing the heat sink 112 to the housing 106 and/or the integrated circuit assembly 104 and/or the host circuit board 114. The hardware 134 may include threaded fasteners. The hardware 134 may include compression springs 136 in various embodiments, such as to provide a compressible hold down force, such as to the housing 106.

Figure 2:
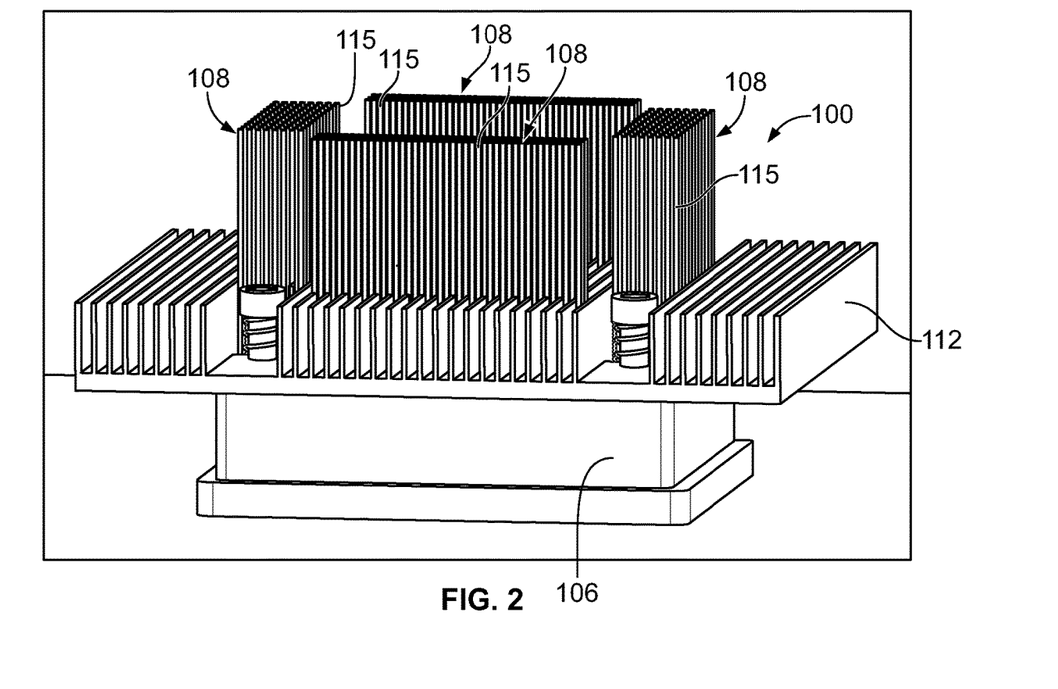
FIG. 2 is a side perspective view of the electronic system showing a cable connector assembly in accordance with an exemplary embodiment.

FIG. 2 is a perspective view of the electronic system 100 in accordance with an exemplary embodiment. FIG. 2 shows the cables 115 of the cable assemblies 108 extending vertically from the housing 106 through the heat sink 112. The thermal shields 110 extend through the heat sink 112 to thermally shield and protect the cables 115.

Figure 3:
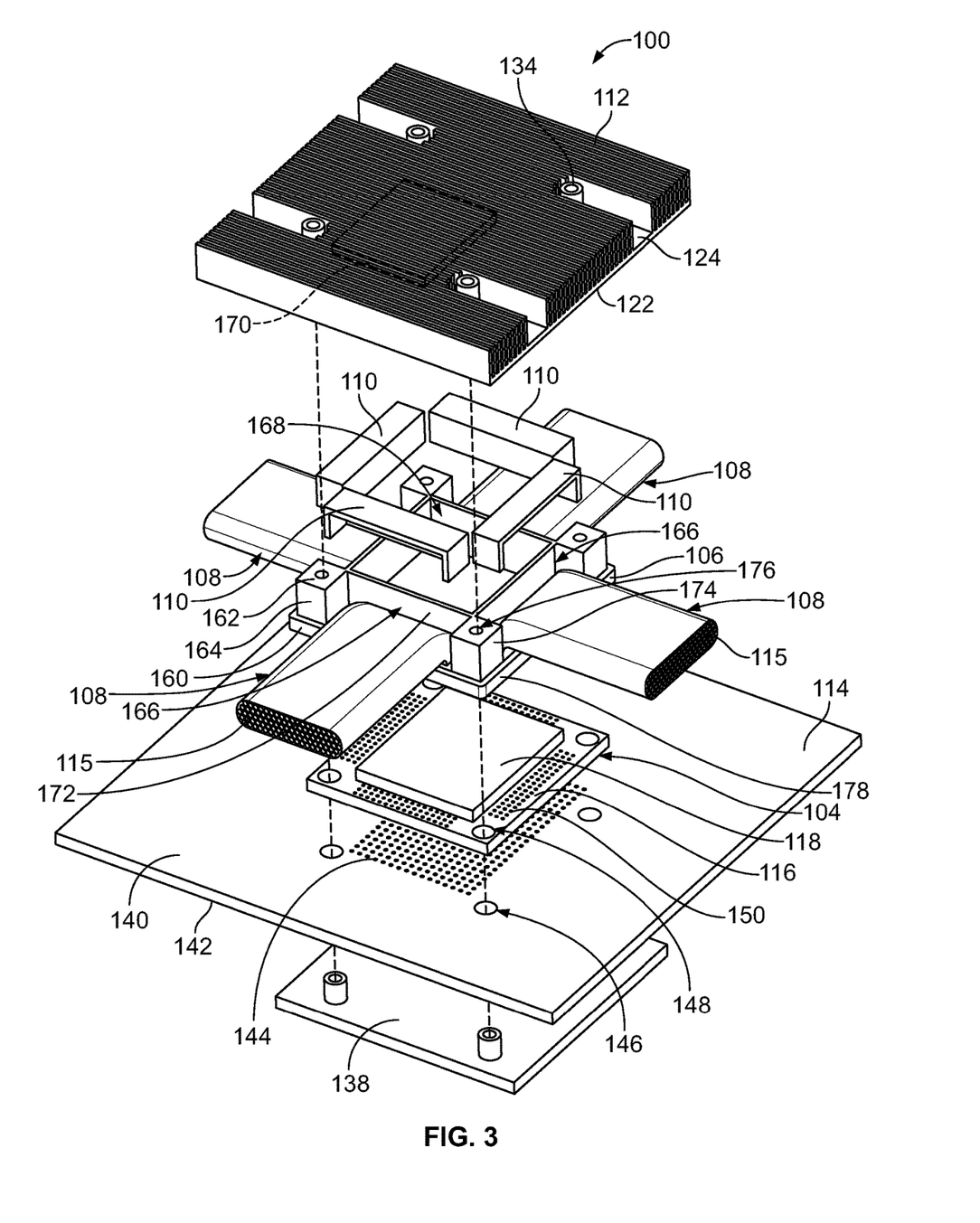
FIG. 3 is an exploded view of the electronic system shown in FIG. 1 in accordance with an exemplary embodiment.

FIG. 3 is an exploded view of the electronic system 100 in accordance with an exemplary embodiment. FIG. 3 illustrates the host circuit board 114, the integrated circuit assembly 104, the housing 106, the cable assemblies 108, the thermal shields 110 and the heat sink 112. In an exemplary embodiment, a bolster plate 138 is used to secure the components together, such as using the hardware 134. For example, the bolster plate 138 is located below the host circuit board 114 and the hardware 134 passes through the heat sink 112, the housing 106, the integrated circuit assembly 104 and the host circuit board 114 to connect with the bolster plate 138. Optionally, features such as threaded posts may extend upward from the bolster plate 138 through the host circuit board 114 and/or the integrated circuit assembly 104 and/or the housing 106 to interface with the hardware 134.

In an exemplary embodiment, the integrated circuit substrate 116 includes an upper surface 140 and a lower surface 142. The integrated circuit component 118 is mounted to the upper surface 140. The lower surface 142 is configured to be mounted to the host circuit board 114. In an exemplary embodiment, the host circuit board 114 includes host conductors 144 arranged in an array for electrical connection with the integrated circuit substrate 116. For example, the host conductors 144 may be solder pads, solder balls, spring beams, or other types of electrical contacts. The integrated circuit substrate 116 includes corresponding lower integrated circuit conductors (not shown) on the lower surface 142 that interface with the host conductors 144. For example, the lower integrated circuit conductors may be solder pads, solder balls, spring beams, or other types of electrical contacts. In an exemplary embodiment, the host circuit board 114 includes openings 146 and the integrated circuit substrate 116 includes openings 148 aligned with the openings 146. The openings 146, 148 receive the posts of the bolster plate 138 and/or the hardware 134.

The integrated circuit component 118 is provided on the upper surface 140. The integrated circuit component 118 may be a chip or other type of integrated circuit. In various embodiments, the integrated circuit component 118 may be an ASIC. The integrated circuit component 118, in the illustrated embodiment, is rectangular and approximately centered on the integrated circuit substrate 116; however, the integrated circuit component 118 may have other shapes or locations in alternative embodiments. In an exemplary embodiment, the integrated circuit substrate 116 includes upper integrated circuit conductors 150 at the top of the integrated circuit substrate 116. The upper integrated circuit conductors 150 are configured to be connected to corresponding cable assemblies 108. In the illustrated embodiment, the upper integrated circuit conductors 150 are arranged in subsets, each subset configured to interface with a different cable assembly 108. In various embodiments, subsets may be provided on multiple sides of the integrated circuit component 118. For example, in the illustrated embodiment, subsets of the upper integrated circuit conductors 150 are provided on all four sides of the integrated circuit component 118. Other arrangements are possible in alternative embodiments.

In various embodiments, the upper integrated circuit conductors 150 are electrical conductors, such as pads, vias, traces or other circuit components of the integrated circuit substrate 116. In other various embodiments, the upper integrated circuit conductors 150 may include electrical contacts mounted to the upper surface 140, such as spring contacts having spring beams configured to be compression connected to the cable assembly 108. In other various embodiments, the upper integrated circuit conductors 150 may include fiber-optic elements for connecting to fiber-optic cables, such as when the cables 115 of the cable assembly 108 are fiber-optic cables.

During assembly, the integrated circuit assembly 104 is mounted to the host circuit board 114. The housing 106 is coupled to the integrated circuit assembly 104 over the upper surface 140 of the integrated circuit substrate 116. In various embodiments, the cable assemblies 108 may be coupled to the housing 106 prior to mounting the housing 106 to the integrated circuit assembly 104 and the host circuit board 114. Alternatively, the cable assemblies 108 may be coupled to the housing 106 and the integrated circuit assembly 104 after the housing 106 is mounted to the integrated circuit assembly 104 and the host circuit board 114. In other various embodiments, the cable assemblies 108 may be coupled to the integrated circuit assembly 104 prior to mounting the housing 106 to the integrated circuit assembly 104 and the host circuit board 114. During assembly, the thermal shields 110 are coupled to the housing 106 and the corresponding cable assemblies 108. The heat sink 112 is coupled to the housing 106 over the thermal shields 110 and the cable assemblies 108.

In an exemplary embodiment, the housing 106 is manufactured from a rigid material, such as a plastic material or a metal material. Optionally, the housing 106 may be thermally conductive to dissipate heat from the integrated circuit assembly 104. The housing 106 extends between a first end 160 and a second end 162. In the illustrated embodiment, the first end 160 is provided at a bottom of the housing 106 and the second end 162 is provided at a top of the housing 106. The first end 160 is mounted to the integrated circuit substrate 116 over the integrated circuit substrate 116 and/or the integrated circuit component 118. The second end 162 supports the heat sink 112 at a positioned above the integrated circuit assembly 104.

The housing 106 includes sides 164 (for example, four sides defining a rectangular or square housing) extending between the first end 160 and the second end 162. In an exemplary embodiment, the housing 106 includes pockets 166 that receive corresponding cable assemblies 108. In various embodiments, pockets 166 may be provided at each of the sides 164. The pockets 166 extend through the housing 106. Optionally, the pockets 166 may be open at a top and a bottom thereof to receive the cable assemblies 108 and/or to allow the cable assemblies 108 to interface with the integrated circuit substrate 116.

The housing 106 includes a cavity 168 that is open through the housing 106. The cavity 168 is configured to be aligned with the integrated circuit component 118. Optionally, the integrated circuit component 118 may extend into the cavity 168. The cavity 168 is configured to receive a portion of the heat sink 112, such as a connecting portion 170 (shown in phantom) extending below the plate 124 at the bottom 122 of the heat sink 112. The connecting portion 170 is sized and shaped to fit in the cavity 168. The connecting portion 170 is sized and shaped to interface with the integrated circuit component 118. For example, the connecting portion 170 may have a planar bottom surface configured to interface with a planar top surface of the integrated circuit component 118 to dissipate heat from the integrated circuit component 118. In an exemplary embodiment, the heat sink 112 is configured to be in direct thermal contact with the integrated circuit component 118. In an exemplary embodiment, the cavity 168 is defined by sidewalls 172 extending along each of the sides 164. The sidewalls 172 may be provided between the cavity 168 and the pockets 166. In an exemplary embodiment, the cavity 168 is open at the first end 160, such as to receive the heat sink 112, and is open at the second end 162, such as to receive the integrated circuit component 118.

In an exemplary embodiment, the housing 106 includes mounting posts 174 for mounting the housing 106 to the integrated circuit assembly 104 and/or to the host circuit board 114 and/or to the bolster plate 138. In an exemplary embodiment, the heat sink 112 is coupled to the mounting posts 174. For example, the hardware 134 is received in the openings 176 in the mounting posts 174. In the illustrated embodiment, the mounting posts 174 are provided at each of the corners of the housing 106; however, other locations are possible in alternative embodiments. The pockets 166 may be located between corresponding mounting posts 174. Optionally, the housing 106 may include a flange 178 extending around an outer perimeter of the housing 106, such as at the second end 162. The pockets 166 may extend through the flange 178.

Figure 4:
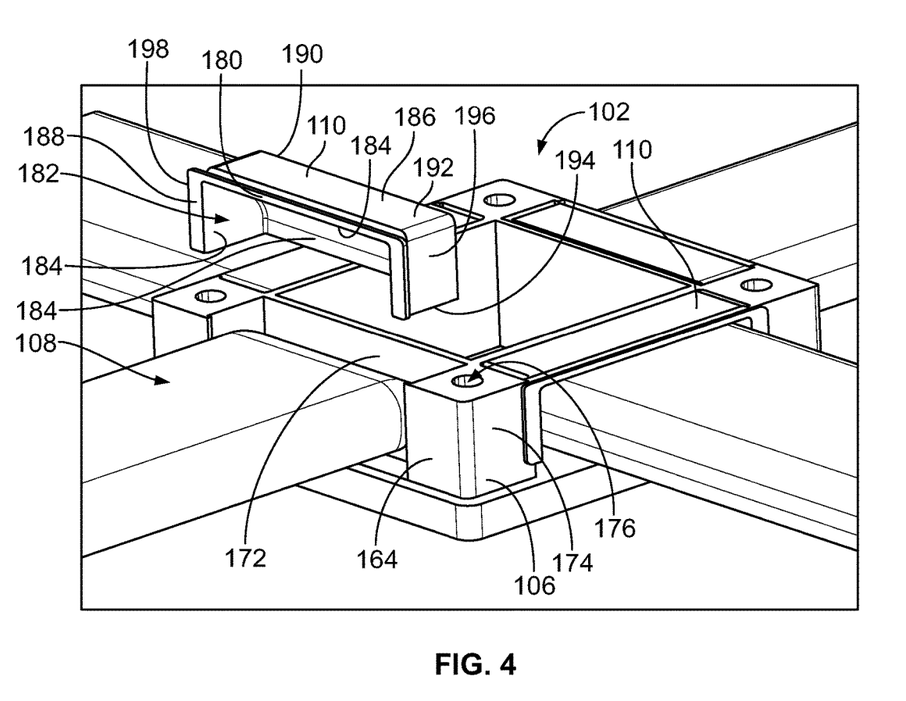
FIG. 4 is a perspective view of the cable connector assembly shown in FIG. 1 in accordance with an exemplary embodiment.

FIG. 4 is a perspective view of the cable connector assembly 102 in accordance with an exemplary embodiment. FIG. 4 illustrates one of the thermal shields 110 poised for coupling to the housing 106. The thermal shield 110 includes a shield body 180 forming an opening 182 that receives the cable 115 of the cable assembly 108. The shield body 180 provides thermal shielding for the cable 115 of the cable assembly 108, such as to thermally shield the cable 115 from the heat sink 112. The shield body 180 may provide thermal shielding for the cable 115 from the housing 106.

The shield body 180 includes one or more thermal shielding walls 184 defining the opening 182. The thermal shielding walls 184 are configured to be positioned between the cables 115 and the heat sink 112 to provide a thermal barrier between the cables 115 and the heat sink 112. The thermal shielding walls 184 are manufactured from a material having high thermal resistance. For example, the thermal shielding walls 184 may be manufactured from high-performance plastics, such as liquid crystal polymers, fluoropolymers, polytetrafluoroethylene (PTFE), polyphenylene sulfide (PPS), polyetheretherketone (PEEK), ceramics, and the like. In an exemplary embodiment, the thermal shielding walls 184 are manufactured from a material having a heat capacity greater than a heat capacity of air (e.g., 1.0 joule/kelvin).

In an exemplary embodiment, the thermal shield 110 includes a shell 186 around the shield body 180. The shell 186 forms an outer layer of the thermal shield 110, whereas the shield body 180 forms an inner layer of the thermal shield 110. In various embodiments, the shell 186 may be manufactured from a metal material, such as copper or stainless steel. Optionally, the shield body 180 has a thermal resistance higher than a thermal resistance of the material of the shell 186 and higher than a thermal resistance of the material of the housing 106.

In an exemplary embodiment, the thermal shield 110 includes a front 188, a rear 190, a top 192, a bottom 194, a first end 196, and a second end 198. In the illustrated embodiment, the opening 182 is open at the front 188 and at the bottom 194 to direct the cables 115 at right angles between the front 188 and the bottom 194. As such, the cables 115 may interface with the integrated circuit substrate 116 and then transition to extend from the side 164 of the housing 106, such as horizontally. In an exemplary embodiment, the thermal shielding walls 184 extend along the rear 190, the top 192, the first end 196, and the second end 198. In an exemplary embodiment, the thermal shield 110 is loaded into the housing 106 from above. The thermal shielding wall 184 at the rear 190 is configured to be positioned between the cable 115 and the sidewall 172. The thermal shielding walls 184 at the first and second ends 196, 198 are configured to be positioned between the cable 115 and the mounting posts 174. When the thermal shield 110 is coupled to the housing 106, the thermal shielding wall 184 at the top 192 extends along a top of the cable 115, such as for providing a thermal barrier between the cable 115 and the heat sink 112.

Figure 5:
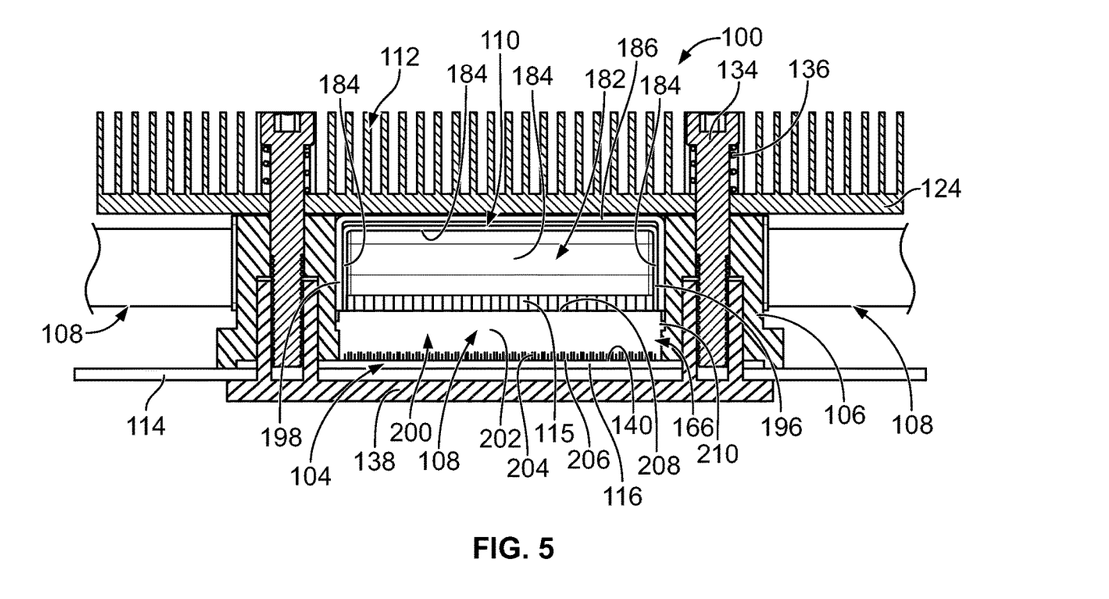
FIG. 5 is a cross-sectional view of the electronic system taken along a vertical plane in accordance with an exemplary embodiment.

FIG. 5 is a cross-sectional view of the electronic system 100 taken along a vertical plane through one of the thermal shields 110 in accordance with an exemplary embodiment. FIG. 5 illustrates the integrated circuit assembly 104 mounted to the host circuit board 114. FIG. 5 illustrates the housing 106 holding the cable assembly 108 and the thermal shield 110 over the integrated circuit assembly 104 with the cable assembly 108 coupled to the integrated circuit assembly 104. FIG. 5 illustrates the heat sink 112 coupled to the housing 106 using the hardware 134 and the bolster plate 138. The compression springs 136 press the heat sink 112 downward against the housing 106 and the thermal shield 110. In various embodiments, the compression force of the compression springs 136 may be transferred from the thermal shield 110 and/or the housing 106 to the cable assembly 108 for compression mounting the cable assembly 108 to the integrated circuit assembly 104.

The heat sink 112 is used to dissipate heat from the integrated circuit assembly 104. The thermal shield 110 provides a thermal barrier between the cables 115 and the heat sink 112. For example, the thermal shielding wall 184 forms a thermal barrier between the plate 124 of the heat sink 112 and the cables 115. The cables 115 are configured to transition in the opening 182, such as from a vertical orientation to a horizontal orientation, with the thermal shielding wall 184 defining a thermal barrier between the heat sink 112 and the cables 115.

In an exemplary embodiment, each cable assembly 108 includes a cable module 200 received in the pocket 166 of the housing 106. The cable module 200 includes a connector housing 202 holding conductors 204 arranged in a row. The connector housing 202 has a mating end 206 and a cable end 208. The mating end 206 faces the integrated circuit substrate 116. The conductors 204 are arranged at the mating end 206 for interfacing with the upper integrated circuit conductors 150 (shown in FIG. 3) on the upper surface 140 of the integrated circuit substrate 116. The cables 115 are connected to corresponding conductors 204. The cables 115 extend from the cable end 208 into the opening 182 and the thermal shield 110.

In an exemplary embodiment, the connector housing 202 includes locating features 210 configured to locate the connector housing 202 within the housing 106. In the illustrated embodiment, the locating features 210 are tabs extending from opposite sides of the connector housing 202. The locating features 210 are received in channels or grooves formed in the housing 106 to locate the connector housing 202 relative to the housing 106.

Optionally, the thermal shield 110 may engage the cable end 208 of the connector housing 202 to hold the cable module 200 in the housing 106. For example, the shell 186 may engage the connector housing 202. For example, the shell 186 at the first and second ends 196, 198 may engage opposite sides of the connector housing 202. Optionally, the shell 186 may press the connector housing 202 downward into the pocket 166. For example, the heat sink 112 may be compressed against the shell 186 using the compression springs 136, and the compression force from the heat sink 112 to the thermal shield 110 may be transferred to the connector housing 202 to provide a compression force for compression mounting the cable module 200 to the integrated circuit assembly 104.

Figure 6:
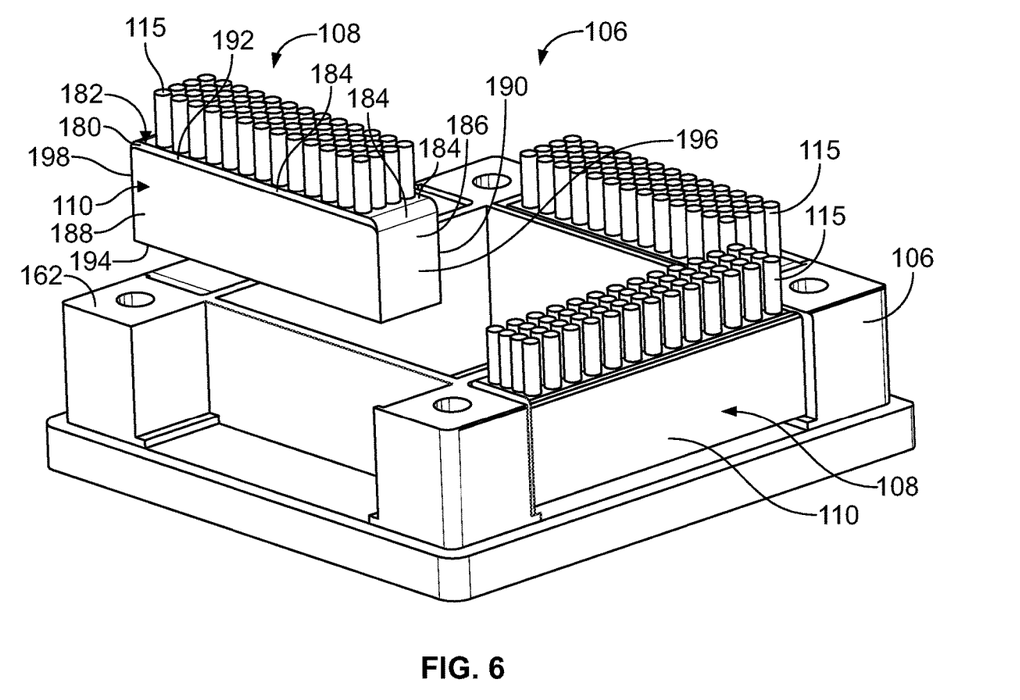
FIG. 6 is a perspective view of the cable connector assembly shown in FIG. 2 in accordance with an exemplary embodiment.

FIG. 6 is a perspective view of the cable connector assembly 102 in accordance with an exemplary embodiment showing the cables 115 extending vertically rather than horizontally. The cables 115 are configured to extend through the heat sink 112 rather than being routed out from the side of the housing 106 and staying at a vertical position that is below the heat sink 112. The thermal shields 110 have a different shape and orientation in the illustrated embodiment compared to the embodiment illustrated in FIG. 4. Like reference numerals are used to identify like components of the thermal shields in the embodiment illustrated in FIG. 6.

Each thermal shield 110 includes the shield body 180 forming the opening 182 that receives the cable 115 of the cable assembly 108. The opening passes straight through the thermal shield 110 rather than being a right angle opening, as with the embodiment shown in FIG. 4. The shield body 180 provides thermal shielding for the cable 115 of the cable assembly 108, such as to thermally shield the cable 115 from the heat sink 112 (shown in FIG. 7). The shield body 180 may provide thermal shielding for the cable 115 from the housing 106.

The shield body 180 includes the thermal shielding walls 184 defining the opening 182. The thermal shield 110 includes the shell 186 around the shield body 180. In an exemplary embodiment, the thermal shield 110 includes the front 188, the rear 190, the top 192, the bottom 194, the first end 196, and the second end 198. In the illustrated embodiment, the opening 176 is open at the top 192 and at the bottom 194 to direct the cables 115 straight through the shield body 180. The cables 115 are configured to pass vertically through the thermal shield 110. In an exemplary embodiment, the thermal shielding walls 184 extend along the front 188, the rear 190, the first end 196, and the second end 198. The thermal shield 110 is loaded into the housing 106 from above. In an exemplary embodiment, the thermal shields 110 are configured to extend above the top or second end 162 of the housing 106. For example, the thermal shield 110 are configured to extend into and/or through the heat sink 112.

Figure 7:
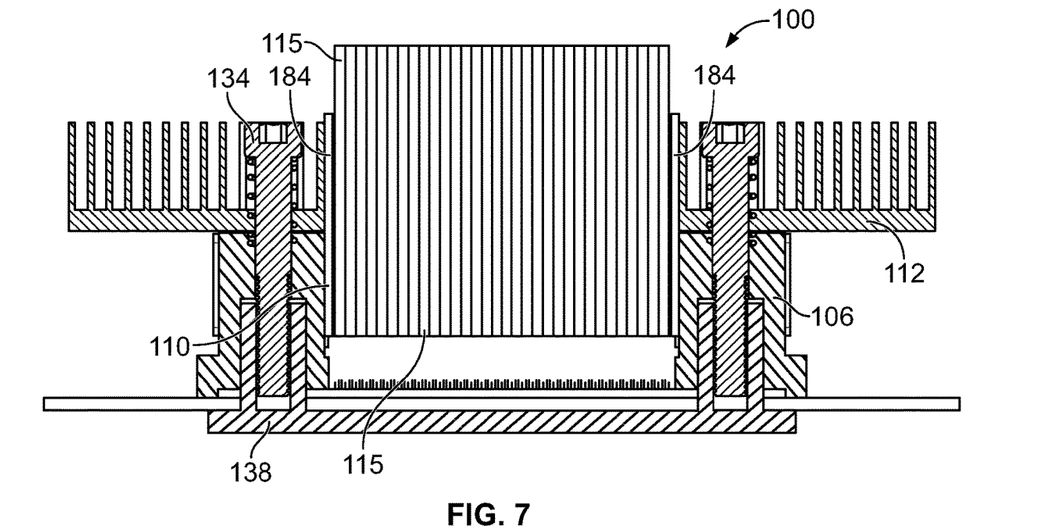
FIG. 7 is a cross-sectional view of the electronic system taken along a vertical plane in accordance with an exemplary embodiment.

FIG. 7 is a cross-sectional view of the electronic system 100 taken along a vertical plane through one of the thermal shields 110 in accordance with an exemplary embodiment. FIG. 7 illustrates the vertical-type thermal shield shown in FIG. 6 relative to the heat sink 112. The heat sink 112 is coupled to the housing 106 using the hardware 134 and the bolster plate 138. The thermal shield 110 extends into and through the heat sink 112. The thermal shield 110 provides a thermal barrier between the cables 115 and the heat sink 112. The thermal shielding walls 184 form a thermal barrier between the heat sink 112 and the cables 115. In various embodiments, the cables 115 are protected through the entire height of the heat sink by the thermal shield 110.

Figure 8:
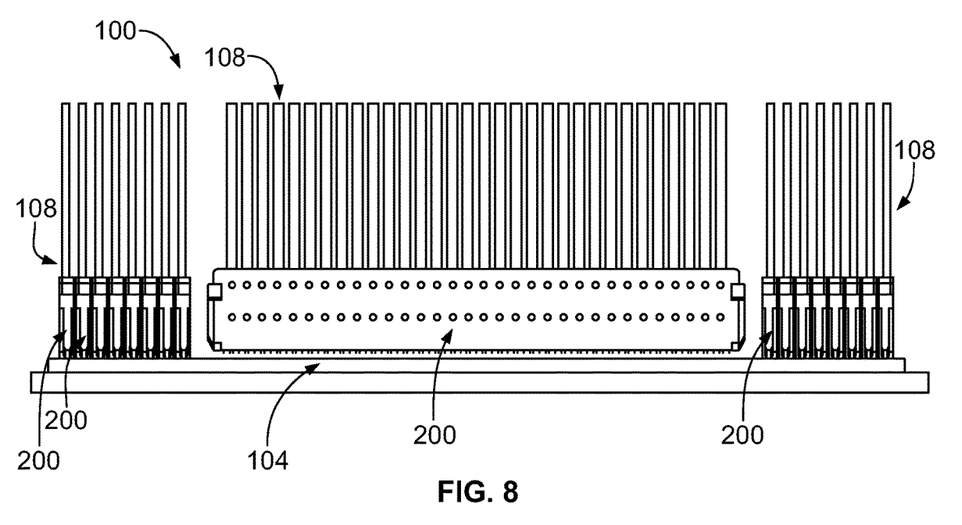
FIG. 8 is a side view of a portion of the electronic system in accordance with an exemplary embodiment.

FIG. 8 is a side view of a portion of the electronic system 100 in accordance with an exemplary embodiment. FIG. 8 illustrates the cable assemblies 108 and the integrated circuit assembly 104. The housing 106 and the heat sink 112 (both shown in FIG. 7) are removed to illustrate the cable assemblies 108 relative to the integrated circuit assembly 104. The cable assembly 108 in the center of FIG. 8 is poised for coupling to the integrated circuit assembly 104. In an exemplary embodiment, the cable assemblies 108 include multiple cable modules 200 arranged in a stacked arrangement.

Figure 9:
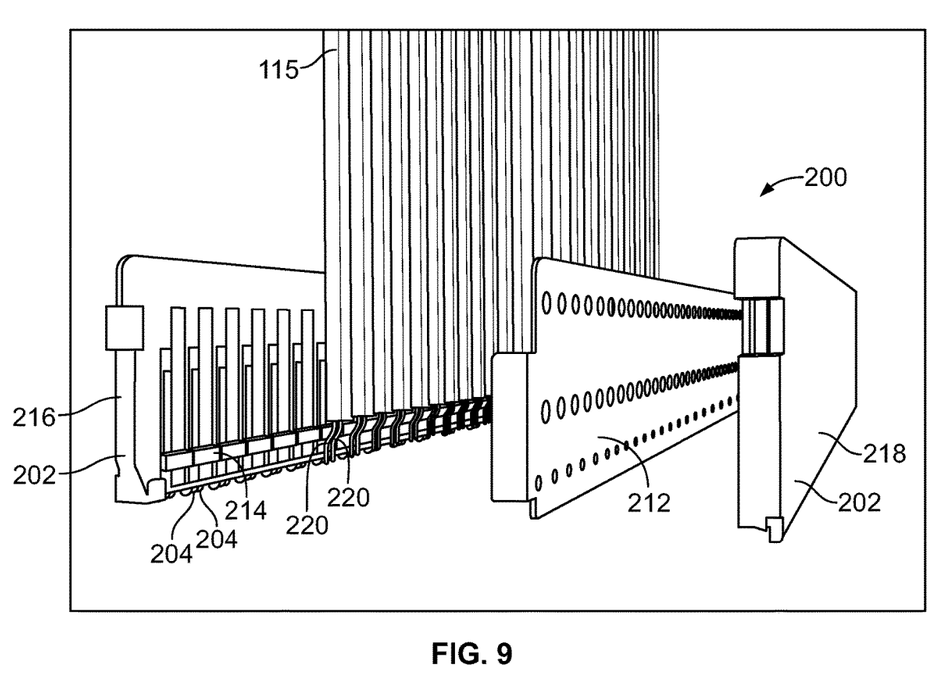
FIG. 9 is an exploded view of a cable module of the cable connector assembly in accordance with an exemplary embodiment.

FIG. 9 is an exploded view of the cable module 200 in accordance with an exemplary embodiment. The cable module 200 includes the connector housing 202, the conductors 204, the cables 115, a ground plate 212 held by the connector housing 202, and ground blades 214 held by the connector housing 202. In an exemplary embodiment, the connector housing 202 is a multipiece housing having a first housing member 216 and a second housing member 218 configured to be coupled together to form the connector housing 202. In other various embodiments, the connector housing 202 may be a single piece housing.

In an exemplary embodiment, the ground blades 214 are held by the first housing member 216 and the ground plate 212 is held by the second housing member 218. The ground plate 212 and the ground blades 214 provide electrical shielding for the conductors 204, such as on multiple sides of the conductors 204. The conductors 204 are arranged in the connector housing 202 for coupling to the cables 115, such as to cable conductors 220. In various embodiments, the cable conductors 220 are copper wires extending along the cables 115. In other various embodiments, the cable conductors 220 are optical fibers extending along the cables 115.

Figure 10:
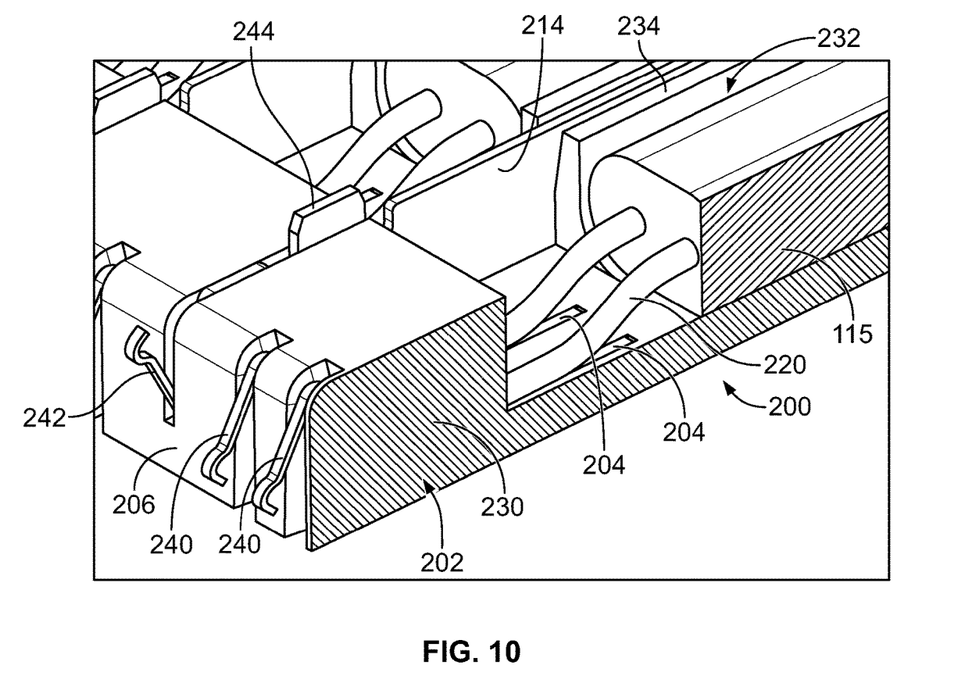
FIG. 10 is a bottom perspective, partial sectional view of a portion of the cable module in accordance with an exemplary embodiment.
Figure 11:
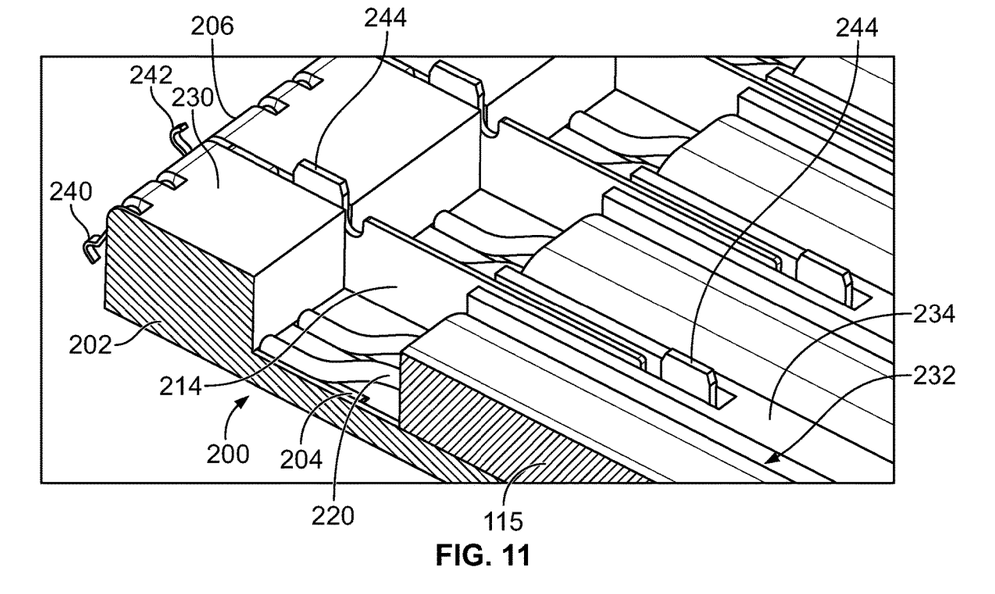
FIG. 11 is a top perspective, partial sectional view of a portion of the cable module in accordance with an exemplary embodiment.

FIG. 10 is a bottom perspective, partial sectional view of a portion of the cable module 200 in accordance with an exemplary embodiment. FIG. 11 is a top perspective, partial sectional view of a portion of the cable module 200 in accordance with an exemplary embodiment.

The connector housing 202 includes a base wall 230 at the mating end 206. The connector housing 202 includes cable channels 232 separated by divider walls 234 above the base wall 230. The cables 115 are received in corresponding cable channels 232. The conductors 204 are held in the base wall 230 and extend into corresponding cable channels 232. The cable conductors 220 are coupled to the conductors 204. For example, the cable conductors 220 may be soldered to edges of the conductors 204 in the cable channels 232. In an exemplary embodiment, the conductors 204 include spring beams 240 at the mating end 206. The spring beams 240 extend from the base wall 230 and are configured to be coupled to the integrated circuit assembly 104 (shown in FIG. 1). Other types of mating ends may be provided in alternative embodiments, such as compliant pins, solder tails, or other types of mating ends.

The ground blades 214 are coupled to the base wall 230 and/or the divider walls 234. The ground blades 214 provide electrical shielding between the cable channels 232. The ground blades 214 include spring beams 242 at the mating ends 206. The spring beams 242 extend from the base wall 230 and are configured to be coupled to the integrated circuit assembly 104. Other types of mating ends may be provided in alternative embodiments, such as compliant pins, solder tails, or other types of mating ends. The ground blades 214 include mating tabs 244 extending from the base wall 230 and/or the divider wall 234. The mating tabs 244 are configured to engage the ground plate 212 (shown in FIG. 9) to electrically connect the ground blade 214 to the ground plate 212. In an exemplary embodiment, as illustrated in FIG. 10, the spring beams 242 of the ground blades 214 extend in an opposite direction as the spring beams 240 of the conductors 204.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A cable connector assembly for an electronic system comprising:
   a housing having a first end and a second end, the first end configured to be mounted to an integrated circuit substrate over an integrated circuit component on the integrated circuit substrate, the second end configured to support a heat sink used to dissipate heat from the integrated circuit component, the housing including a pocket open through the housing;
   a cable module received in the pocket, the cable module including a connector housing holding conductors arranged in a row, the connector housing having a mating end and a cable end, the mating end facing the integrated circuit substrate and the conductors arranged at the mating end for interfacing with integrated circuit conductors of the integrated circuit substrate, the cable module including cables connected to corresponding conductors, the cables extending from the cable end; and
   a thermal shield received in the pocket, the thermal shield having an opening receiving the cables, the thermal shield having a thermal shielding wall positioned between the cables and the heat sink to provide a thermal barrier between the cables and the heat sink.

2. The cable connector assembly of claim 1, wherein the thermal shield includes an outer shell and an inner thermal shield body defining the opening, the thermal shield body having a thermal resistance higher than a thermal resistance of the outer shell and higher than a thermal resistance of the housing.

3. The cable connector assembly of claim 1, wherein the thermal barrier of the thermal shield has a heat capacity greater than a heat capacity of air.

4. The cable connector assembly of claim 1, wherein the thermal shielding wall physically isolates the cables from the heat sink.

5. The cable connector assembly of claim 1, wherein the thermal shielding wall fills a space between the cables and the heat sink.

6. The cable connector assembly of claim 1, wherein the thermal shielding wall includes an outer surface engaging the heat sink and an inner surface defining the opening and engaging the cables.

7. The cable connector assembly of claim 1, wherein the thermal shielding wall is coplanar with the second end of the housing.

8. The cable connector assembly of claim 1, wherein the thermal shielding wall extends beyond the second end of the housing into the heat sink.

9. The cable connector assembly of claim 1, wherein the thermal shield includes a front, a rear, a top, a bottom, a first end, and a second end, the opening being open at the front and at the bottom to direct the cables at a right angle between the front and the bottom.

10. The cable connector assembly of claim 1, wherein the cables exit the housing from a side of the housing and a vertical height below the second end and above the first end, the thermal shielding wall be located above the cables between the cables and the heat sink.

11. The cable connector assembly of claim 1, wherein the thermal shield includes a top and a bottom, the thermal shield including sides between the top and the bottom, the opening being open at the top and being open at the bottom, the cables passing vertically straight through the thermal shield between the bottom and the top.

12. The cable connector assembly of claim 11, wherein the top is located above the second end of the housing, the top being located at or above a top of the heat sink.

13. The cable connector assembly of claim 1, wherein the cable module is a first cable module and the thermal shield is a first thermal shield, the cable connector assembly further comprising a second cable module and a second thermal shield receiving cables of the second cable module, the second thermal shield including a thermal shielding wall positioned between the cables of the second cable module and the heat sink, wherein the thermal shielding wall of the first thermal shield and the thermal shielding wall of the second thermal shield are positioned between the heat sink and the corresponding first cable module and the second cable module.

14. The cable connector assembly of claim 1, wherein the conductors comprise contacts electrically connected to corresponding cables.

15. The cable connector assembly of claim 14, wherein the contacts comprise spring beams being compression mounted to the integrated circuit conductors of the integrated circuit socket at a separable mating interface.

16. The cable connector assembly of claim 15, wherein the thermal shield engages the connector housing to provide a compression force for compression mounting the spring beams of the contacts to the integrated circuit conductors.

17. The cable connector assembly of claim 15, further comprising ground blades held in the connector housing between corresponding contacts to provide electrical shielding between the contacts, the ground blades being electrically connected to the integrated circuit substrate.

18. The cable connector assembly of claim 1, wherein the conductors comprise fiber-optic elements optically coupled to fibers of the cable.

19. A cable connector assembly for an electronic system comprising:
- a housing having a first end and a second end, the housing having sides extending between the first end and the second end, the housing having a cavity defined by the sides between the first end and the second end, the first end configured to be mounted to an integrated circuit substrate over an integrated circuit component on the integrated circuit substrate, the cavity being open at the first end to expose the integrated circuit component through the cavity, the second end configured to support a heat sink used to dissipate heat from the integrated circuit component, the cavity being open at the second end to receive a connecting portion of the heat sink used to thermally connect to the integrated circuit component, the housing including pockets at corresponding sides open through the housing;
- cable modules received in corresponding pockets, each cable module including a connector housing holding conductors arranged in a row, the connector housing having a mating end and a cable end, the mating end facing the integrated circuit substrate and the conductors arranged at the mating end for interfacing with integrated circuit conductors of the integrated circuit substrate, the cable module including cables connected to corresponding conductors, the cables extending from the cable end; and
- thermal shields received in corresponding pockets and receiving corresponding cable modules, each thermal shield having an opening receiving the cables of the corresponding cable module, the thermal shield having a thermal shielding wall positioned between the cables and the heat sink to provide a thermal barrier between the cables and the heat sink.

20. An electronic system comprising:
- a host circuit board having host conductors;
- an integrated circuit assembly coupled to the host circuit board, the integrated circuit assembly having an integrated circuit substrate including upper integrated circuit conductors on an upper surface of the integrated circuit substrate and lower integrated circuit conductors on a lower surface of the integrated circuit substrate, the lower integrated circuit conductors being coupled to corresponding host conductors, the integrated circuit assembly including an integrated circuit component on the upper surface of the integrated circuit substrate;
- a heat sink coupled in thermal communication with the integrated circuit substrate; and
- a cable connector assembly coupled to the integrated circuit assembly, the cable connector assembly including a housing having a first end and a second end, the first end mounted to the integrated circuit substrate over the integrated circuit component, the second end supporting the heat sink above the integrated circuit component, the housing including a pocket open through the housing, the cable connector assembly including a cable module received in the pocket, the cable module including a connector housing holding conductors arranged in a row, the connector housing having a mating end and a cable end, the mating end facing the integrated circuit substrate and the conductors arranged at the mating end for interfacing with the upper integrated circuit conductors, the cable module including cables connected to corresponding conductors, the cables extending from the cable end, the cable connector assembly including a thermal shield received in the pocket, the thermal shield having an opening receiving the cables, the thermal shield having a thermal shielding wall positioned between the cables and the heat sink to provide a thermal barrier between the cables and the heat sink.

* * * * *